(12) United States Patent
Menon et al.

(10) Patent No.: US 7,456,076 B2
(45) Date of Patent: Nov. 25, 2008

(54) TECHNIQUES FOR FORMING PASSIVE DEVICES DURING SEMICONDUCTOR BACK-END PROCESSING

(75) Inventors: Santosh S. Menon, Troutdale, OR (US); Hemanshu D. Bhatt, Vancouver, WA (US)

(73) Assignee: LSI Corporation, Milpitas, CA (US)

( * ) Notice: Subject to any disclaimer, the term of this patent is extended or adjusted under 35 U.S.C. 154(b) by 41 days.

(21) Appl. No.: 11/506,659

(22) Filed: Aug. 18, 2006

(65) Prior Publication Data

US 2006/0279005 A1 Dec. 14, 2006

Related U.S. Application Data

(62) Division of application No. 10/944,373, filed on Sep. 16, 2004, now Pat. No. 7,122,436.

(51) Int. Cl.
*H01L 21/20* (2006.01)

(52) U.S. Cl. .................. 438/385; 438/210; 438/238; 438/384; 257/E21.006; 257/E21.496

(58) Field of Classification Search ............... 438/385, 438/190, 210, 238, 329, 330, 331, 332, 382, 438/383, 384, FOR. 429; 257/E21.006, E21.004, 257/E21.005, E21.3, E21.315, E21.496
See application file for complete search history.

(56) References Cited

U.S. PATENT DOCUMENTS

| 4,390,586 | A | 6/1983 | Lemelson |
| 5,436,177 | A | 7/1995 | Zaccherini |
| 6,261,946 | B1 * | 7/2001 | Iacoponi et al. ............. 438/637 |
| 6,730,984 | B1 * | 5/2004 | Ballantine et al. ........... 257/537 |
| 6,815,319 | B2 * | 11/2004 | Leidy ......................... 438/543 |

* cited by examiner

*Primary Examiner*—Matthew S. Smith
*Assistant Examiner*—Julio J Maldonado
(74) *Attorney, Agent, or Firm*—Beyer Law Group

(57) ABSTRACT

Fabrication of electronic devices in the "metal layers" of semiconductor devices. Each metal layer includes a dielectric layer that supports a conductive layer, which includes electrically conductive pathways and electronic devices. The metal layers are stacked on top of each other such that the dielectric layers separate the adjacent conductive layers. The electronic devices may be passive devices such as resistors. The resistors are formed by depositing metal onto the dielectric layer and then implanting the metal with oxygen. The conductive layer may be formed of materials such as copper and aluminum.

10 Claims, 6 Drawing Sheets

TECHNIQUES FOR FORMING PASSIVE DEVICES DURING SEMICONDUCTOR BACK-END PROCESSING

RELATED APPLICATIONS

This is a Divisional application of prior U.S. application Ser. No. 10/944,373 entitled "TECHNIQUES FOR FORMNIG PASSIVE DEVICES DURING SEMICONDUCTOR BACK-END PROCESSING", filed on Sep. 16, 2004, and now issued as U.S. Pat. No. 7,122,436 B2, which is incorporated herein by reference and from which priority under 35 U.S.C. § 120 is claimed.

FIELD OF THE INVENTION

The present invention relates generally to semiconductor device fabrication, and more specifically to fabricating electrical circuits during back-end processing operations.

BACKGROUND

Semiconductor fabrication involves complex processes for creating integrated devices within a semiconductor wafer and connecting the integrated devices so that they can communicate with each other. Generally speaking, semiconductor fabrication is divided into two phases of processing: front-end and back-end processing. Front-end processing relates to the process steps that form the integrated devices within the surface of semiconductor wafer substrates. Integrated devices may include active electrical devices such as transistors and passive electrical devices such as capacitors, inductors, and resistors. The front-end process steps include, but are not limited to, photolithography processes, etching processes, and doping or implanting processes. Back-end processing occurs after the completion of the front-end processing steps. The back-end processing steps form multiple and stacked "metal layers" on top of a semiconductor wafer. Each metal layer includes electrically conductive traces for connecting various integrated devices within the semiconductor wafer. A dielectric layer formed of, for example, an oxide separates each of the metal layers and also provides for connectivity between each metal layer through conductive vias. Salicidation processes connect the conductive traces of the metal layers to the integrated devices within the semiconductor substrate. Salicidation may use a material such as a silicide-metal alloy (e.g., nickel or cobalt).

Current semiconductor devices increasingly use resistors to control the timing of transmitted signals within various integrated devices and electrical components. These resistors are formed in the semiconductor wafer using front-end processing steps. Such resistors may be poly-silicon and/or island resistors. Polysilicon resistors are formed on top of a semiconductor wafer substrate and gain a certain resistance through doping or implanting processes. For example, polysilicon may be doped with a material such as boron or arsenic. On the other hand, island resistors are formed within a semiconductor wafer substrate.

Unfortunately, real estate in a semiconductor wafer substrate is usually very limited. The need to create passive components for e.g., resistors and capacitors on Si substrates makes it very challenging to squeeze more transistors onto a wafer substrate. In view of the foregoing, there are continuing efforts to provide improved techniques for fabricating electrical devices, such as resistors, into semiconductor circuits.

BRIEF SUMMARY OF THE INVENTION

The present invention is directed to techniques for fabricating electronic devices in the "metal layers" of semiconductor devices. Each metal layer includes a dielectric layer that supports a conductive layer, which includes electrically conductive pathways and electronic devices. The metal layers are stacked on top of each other such that the dielectric layers separate the adjacent conductive layers. The electronic devices may be passive devices such as resistors. The resistors are formed by depositing metal onto the dielectric layer and then implanting the metal with oxygen. Forming devices within a metal layer of a semiconductor device, rather than within a semiconductor substrate, makes room within the substrate to fabricate additional integrated devices. This is highly advantageous since real estate within semiconductor substrates is very limited.

As a method, one embodiment of the present invention includes at least forming a dielectric mask on a top surface of a semiconductor substrate, the semiconductor substrate containing a plurality of integrated devices, etching recessed regions into a top surface of the dielectric mask, filling the recessed regions with a conductive material to form a resistor in each recessed region, implanting the resistors with oxygen, and annealing the resistors to cause the oxygen to react with the conductive material of the resistor such that the resistor transforms into a metal oxide material having a certain level of resistance.

In another embodiment, a method of the present invention includes at least forming a dielectric mask on a top surface of a semiconductor substrate, the semiconductor substrate containing a plurality of integrated devices, etching recessed regions into a top surface of the dielectric mask, filling the recessed regions with aluminum, implanting the aluminum within each recessed region to form a respective resistor, and annealing the resistors to cause the oxygen to react with the aluminum such that each resistor transforms into an aluminum oxide having a certain level of resistance.

In yet another embodiment, a method of the present invention includes at least forming a dielectric mask on a top surface of a semiconductor substrate, the semiconductor substrate containing a plurality of integrated devices, etching recessed regions into a top surface of the dielectric mask, filling the recessed regions with copper, implanting the copper within each recessed region to form a respective resistor, and annealing the resistors to cause the oxygen to react with the copper such that each resistor transforms into a copper oxide having a certain level of resistance.

As an apparatus, one embodiment of the present invention includes at least a semiconductor substrate containing integrated devices, the semiconductor substrate having a top surface, a dielectric layer formed above the top surface of the semiconductor wafer, a resistor formed within the dielectric layer, and a conductive trace formed within the dielectric layer, the conductive trace being electrically connected to the resistor, wherein the conductive trace is also in electrical communication with at least one of the integrated devices within the semiconductor substrate.

In an alternative embodiment, an apparatus of the present invention includes at least a semiconductor substrate containing integrated devices, the semiconductor substrate having a top surface, a first dielectric layer formed above the top surface of the semiconductor wafer, the first dielectric layer containing a resistor and a conductive trace, the conductive trace being electrically connected to the resistor, wherein the conductive trace is also in electrical communication with at least one of the integrated devices within the semiconductor substrate, and a second dielectric layer formed above the first dielectric layer, the second dielectric layer containing a resistor and a conductive trace, the conductive trace being electrically connected to the resistor.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

The present invention pertains to techniques for fabricating electronic devices in the "metal layers" of semiconductor devices. Each metal layer includes a dielectric layer that supports a conductive layer, which includes electrically conductive pathways and electronic devices. The metal layers are stacked on top of each other such that the dielectric layers separate the adjacent conductive layers. The electronic devices may be passive devices such as resistors. The resistors are formed by depositing metal onto the dielectric layer and then implanting the metal with oxygen. Forming devices within a metal layer of a semiconductor device, rather than within a semiconductor substrate, makes room within the substrate to fabricate additional integrated devices. This is highly advantageous since real estate within semiconductor substrates is very limited.

The present invention will be described with respect to two primary embodiments. The first embodiment, shown in FIGS. 1-7, involves depositing aluminum onto a dielectric layer to form electrically conductive traces and resistors, while the second embodiment, shown in FIGS. 8-14, involves the deposition of copper. Each embodiment illustrates an exemplary technique for depositing a certain type of conductive material, however, it should be understood that the conductive materials in each embodiment may be substituted with other conductive materials.

The two embodiments illustrate exemplary operations for depositing a metal onto an etched surface of a dielectric material. It should be understood that multiple variations of the various processes explained below may substitute for specific operations. For example, various etching, deposition, and implanting processes can be used. Also, it should be understood that some of the processes below relate to commonly understood techniques. For example, processes for photolithography and metal deposition are commonly known. Therefore, for the sake of a clear description that focuses upon the inventive aspect, some process steps are not discussed.

Figure 1:
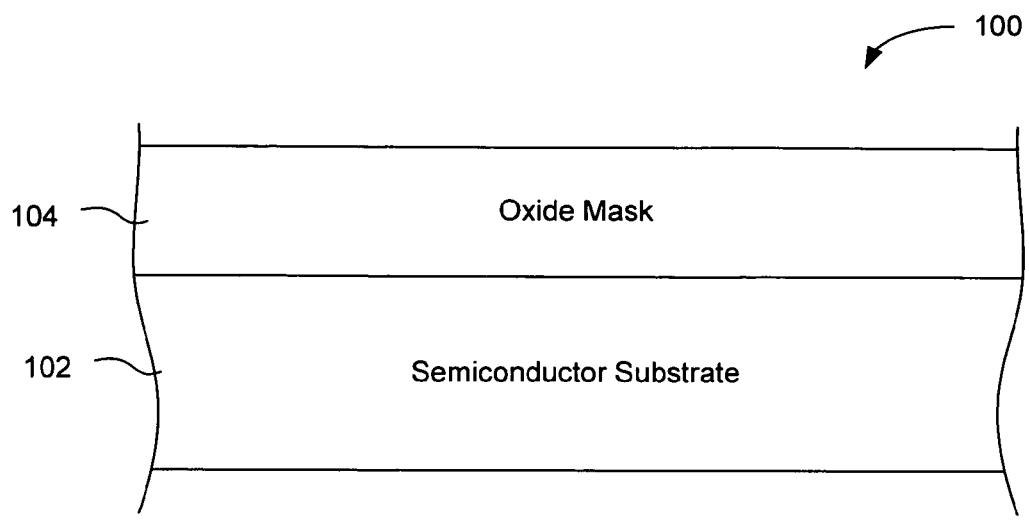
FIG. 1 illustrates a partial side, cross-sectional view of a partially formed semiconductor device, which includes a semiconductor substrate and a dielectric mask, according to one embodiment of the present invention.

The description of the invention now begins with FIG. 1, which begins to describe the first embodiment of the invention. FIGS. 1-6 illustrate a semiconductor device 100 in its various stages as it is fabricated according to techniques of the present invention. FIG. 1 illustrates a partial side, cross-sectional view of a partially formed semiconductor device 100, which includes a semiconductor substrate 102 and a dielectric mask 104, according to one embodiment of the present invention. Only a small portion of substrate 102 is shown so that greater detail for dielectric material layer 104 can be shown in the following figures. Semiconductor substrate 102 is a substrate of semiconductor material that has been through the "front-end" processing operations common to semiconductor fabrication techniques. The "front-end" process operations fabricate the integrated devices on the top surface of substrate 102. Such integrated devices can include active devices such as transistors and passive devices such as capacitors, inductors, and resistors. Semiconductor substrate 102 can be, for example, in the shape of a wafer. Front-end processing completes only a portion of the semiconductor fabrication process.

A "back-end" fabrication process is also required to form multiple "metal layers" on top of the semiconductor substrate 102. Each metal layer includes a dielectric layer, which typically supports conductive traces or pathways. These traces connect to integrate circuits in the semiconductor substrate 102 below so that the circuits can be interconnected. As will be described below, the invention involves fabricating electrical devices, such as resistors, in each metal layer in addition to conductive traces. Dielectric layer 104 of each metal layer serves to separate and insulate the conductive traces of each layer. Dielectric layer 104 may be formed of materials such as, but not limited to, various oxides, $SiO_2$, phosphorus, and fluorine-doped $SiO_2$. Dielectric layer 104, also referred to as an Inter-Metal Dielectric (IMD) or Inter-Layer Dielectric, is an insulator featuring low a dielectric constant k. Dielectric layer 104 is formed upon the surface of semiconductor substrate 102 through processes such as chemical vapor deposition (CVD) and PECVD. The thickness of dielectric layer 104 is approximately in the range of 6000-10,000 Angstroms. This range of dielectric layer 104 thickness is exemplary and the actual thickness of dielectric layers may fall below or exceed the given range. Dielectric layer 104 has approximately a uniform thickness and covers an entire semiconductor substrate, such as a wafer. In some embodiments, dielectric layer 104 may only cover selected regions of a semiconductor substrate 104, such as the regions that contain the integrated devices (also known as "active areas").

As a note, a silicide process is also commonly performed during the front-end processing operations. Silicide processes involve forming silicide contacts in those areas in which deposited metal (which after annealing becomes a metal component of the silicide) is in direct contact with silicon. Silicide processes are commonly implemented in MOS/CMOS processes in which ohmic contacts to the source, drain, and poly-silicon gate are formed.

Figure 2:
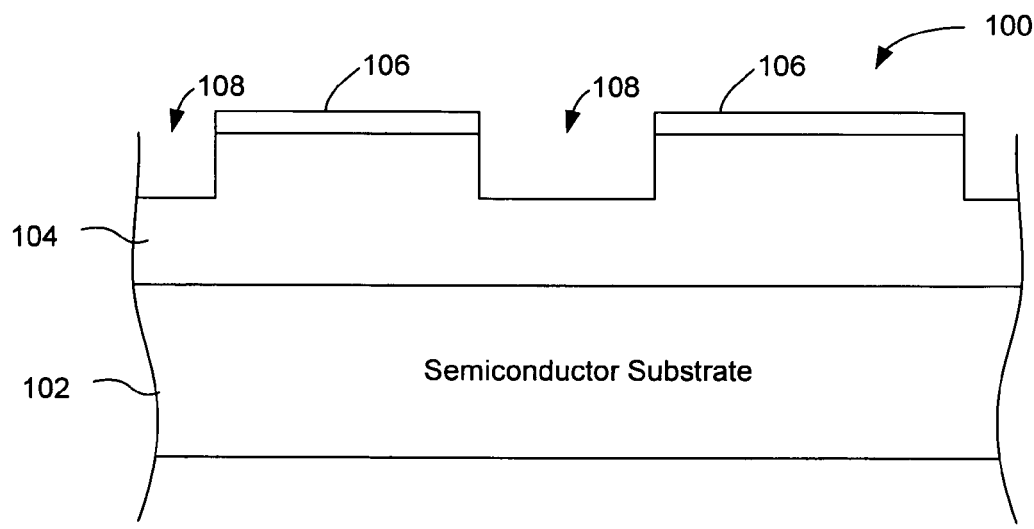
FIG. 2 illustrates the semiconductor device after a photoresist mask has been applied and developed, and after an etching process has been performed.

FIG. 2 illustrates semiconductor device 100 after a photoresist mask 106 has been applied and developed, and after an etching process has been performed. The photoresist mask 106 is typically applied over the entire surface of dielectric layer 104 through commonly understood techniques. Then a light source and a reticle are used to illuminate a pattern of light onto photoresist mask 106. Depending upon whether photoresist mask 106 is a positive tone or a negative tone mask, either the illuminated or non-illuminated portions of photoresist mask 106 are removed. The remaining photoresist mask 106 then has a pattern that corresponds to the illuminated pattern of light. The pattern of the remaining photoresist mask 106 outlines areas of exposed dielectric layer 104 that are to be etched. The areas to be etched will form electronic devices, such as resistors, and conductive pathways or traces. The outlines for the electronic devices may have various outlines including, but not limited to, rectangular, square, oval, and circular. The outline for the conductive pathways may be thin and long paths. The electronic devices are connected to some of the conductive pathways so that they combine to form electrical circuits. These electrical devices then travel down through dielectric layer 104 and connect to integrated devices within semiconductor substrate 102.

The two sections of photoresist mask 106, shown in FIG. 2, are remaining portions of photoresist mask 106 that outline the shape of an etched region 108 that will be used to form an electrical device. The electrical device to be formed within etched or recessed region 108 may be used to control the timing of signals transmitted between various integrated devices. For example, resistors formed within recessed regions 108 can be used for such purposes. These electrical devices can also be used as termination resistors and shunts and to introduce voltage drops.

Etched regions for forming conductive traces are not shown in FIGS. 1-6 to focus the discussion upon forming electrical devices within recessed regions 108. Processes for forming conductive traces within dielectric layer 104, however, are well known to those of ordinary skill in the art. FIG. 7, below, will illustrate conductive traces that are in connection with electrical devices formed in dielectric layer 104.

Commonly known etching techniques are used to etched the areas of dielectric mask 104 that are exposed through the openings of photoresist mask 106. For example, techniques such as chemical etching, plasma etching, and reactive ion etching can be used.

Figure 3:
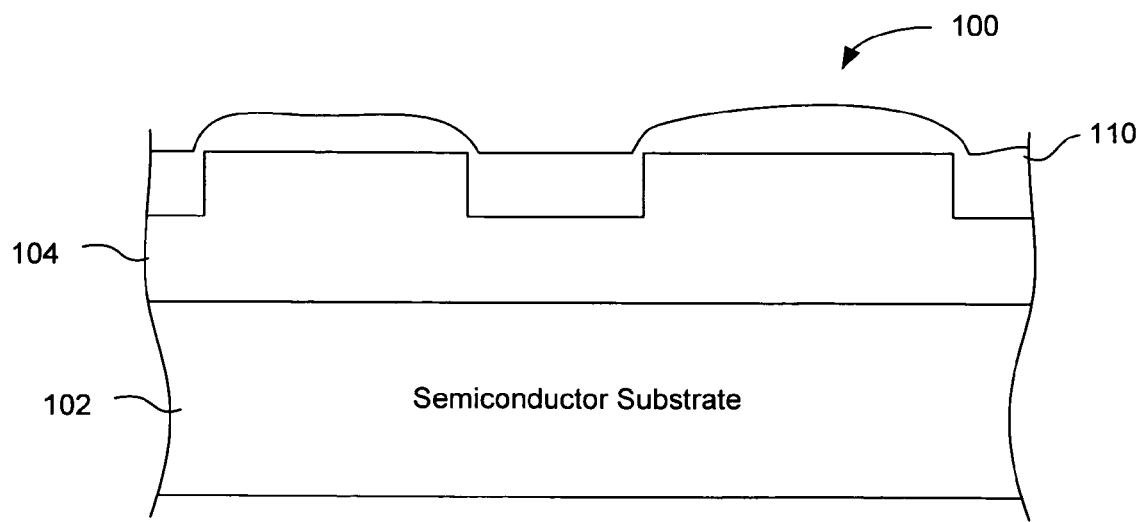
FIG. 3 illustrates the semiconductor device after the photoresist mask has been removed and a conductive material has been deposited upon dielectric layer.

FIG. 3 illustrates semiconductor device 100 after photoresist mask 106 has been removed and a conductive material 110 has been deposited upon dielectric layer 104. Photoresist mask 106 is removed through commonly known stripping techniques. Backside anti-reflective coating is also commonly removed with the photoresist mask 106.

Conductive material 110 is then deposited upon the etched surface of dielectric layer 104. Conductive material 110 may be aluminum. In alternative embodiments, conductive materials 110 may also be, but are not limited to, copper, Ti, and Mo. Conductive material 110 may be deposited using techniques such as, but not limited to, electroplating, physical vapor deposition, chemical vapor deposition, and atomic layer deposition. Conductive material 110 is deposited evenly such that it conforms to the landscape of dielectric layer 104. As shown in FIG. 3, conductive metal 110 conforms such that it fills in recessed regions 108 and rises over areas of dielectric mask 104 that were protected by photoresist 106. Conductive material 110 also fills in the etched regions used to form the conductive pathways.

Figure 4:
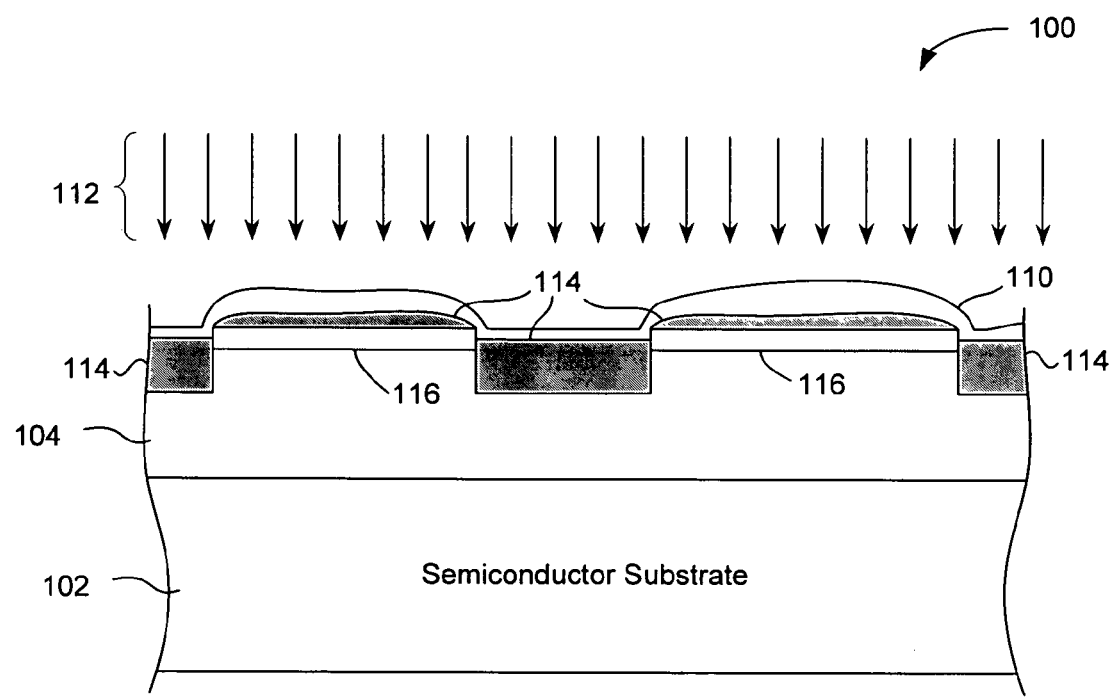
FIG. 4 illustrates the semiconductor device while undergoing an oxygen implanting process.

FIG. 4 illustrates semiconductor device 100 while undergoing an oxygen implanting process. The array of downwardly pointing directional lines 112 represent oxygen molecules being implanted into the surface of conductive material 110. Implanting can be performed through conventionally known processes, such as by placing semiconductor device 100 within an implanter. The oxygen molecules are implanted with a force that causes at least some of the molecules to reach the conductive material 110 at the bottom of each recessed region 108. Cross-hatched areas 114 having lines that fall towards the right represent oxygen implanted regions of conductive material 110. Each of cross-hatched areas 114 have regions of at least substantially pure conductive material above them since the oxygen molecules pass through and do not settle in these upper regions. As will be explained below, it is not necessary to implant the top regions of conductive material 110 with oxygen since these top regions will be removed with a polishing process. However, alternative embodiments of the invention may involve implanting the entire thickness of a conductive material 110 with oxygen.

In addition to migrating through conductive material 110, the oxygen molecules also migrate through a portion of dielectric layer 104. Cross-hatched areas 116 with slanted lines that fall towards the left represent the oxygen implanted regions of dielectric layer 104. The depth to which oxygen molecules migrate through dielectric layer 104 depends upon its covering layer of conductive material. In some embodiments, a large thickness of conductive material 110 prevents any oxygen from reaching dielectric layer 104.

Although not shown in FIG. 4, an optional process of applying a photoresist on top of conductive material 110 can be performed before implantation begins. The photoresist layer can then be exposed and developed to uncover the areas of conductive material 110 to be selectively implanted with oxygen. That is, conductive material 110 within recessed regions 108 will be exposed for the implanting process. At the same time, areas of conductive material 110 that will form conductive traces are left covered by the photoresist layer to prevent oxygen implantation. In this way, resistance is not added to the conductive pathways. After implantation, the photoresist layer is stripped.

In some embodiments, multiple photoresist layers can be successively applied to conductive material 110 in order to implant different dosages of oxygen into various resistors.

Figure 5:
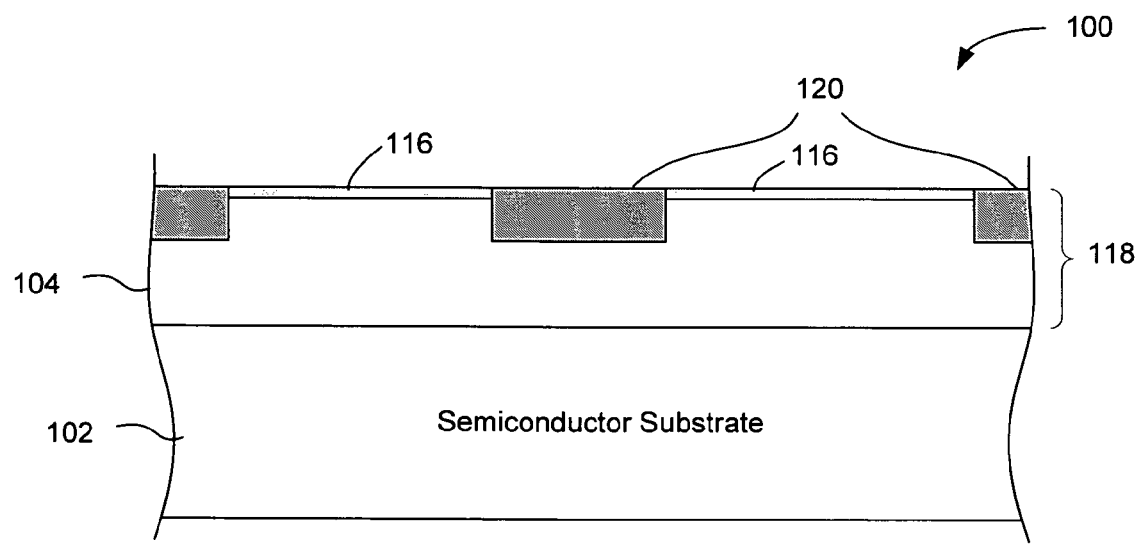
FIG. 5 illustrates the semiconductor device after a polishing process has removed a layer of the conductive material to result in a substantially flat metal layer surface.

FIG. 5 illustrates semiconductor device 100 after a polishing process has removed a layer of conductive material 110 to result in a substantially flat metal layer 118 surface. Metal layer 118 includes the dielectric layer 104, conductive material, and the oxygen implanted conductive material.

A polishing process, such as chemical mechanical polishing, may be used. Various other oxide removal techniques such as, but not limited to, wet chemical etching and plasma etching can also be used. In FIG. 5, the polishing process removes a top layer of conductive material 110 and a portion of the oxygen implanted region 116 of dielectric layer 104. Depending upon the amount of polishing performed, a portion of the oxygen implanted conductive material 114 may also be removed. The polishing process should remove a sufficient amount of conductive material so that unintended electrical connections along the top surface of semiconductor device are completely removed. The remaining conductive material lies within recessed regions 108 and within the recessed regions that form the conductive traces.

The polished semiconductor device 100 is then put through an annealing process where it is heated. The annealing process causes the oxygen molecules to react with the molecules of the conductive material 110 to form, for example, a metal oxide. For example, an aluminum conductive material 110 will combine with the oxygen molecules to form an aluminum oxide, $Al_2O_3$. The resulting metal oxide will have a level of resistance useful for acting as a resistor. Conductive material 110 within each recessed region 108 is now an individual resistor 120.

Figure 6:
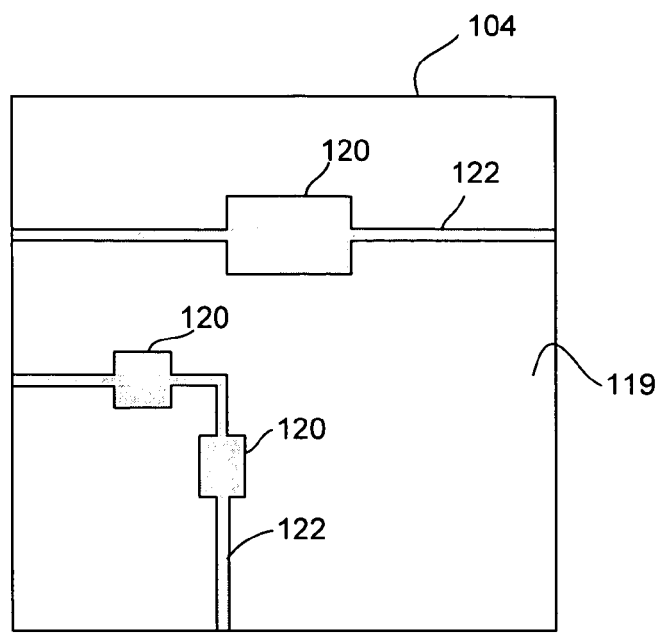
FIG. 6 illustrates a partial, top plan view of a polished dielectric layer according to one embodiment of the present invention.
Figure 7:
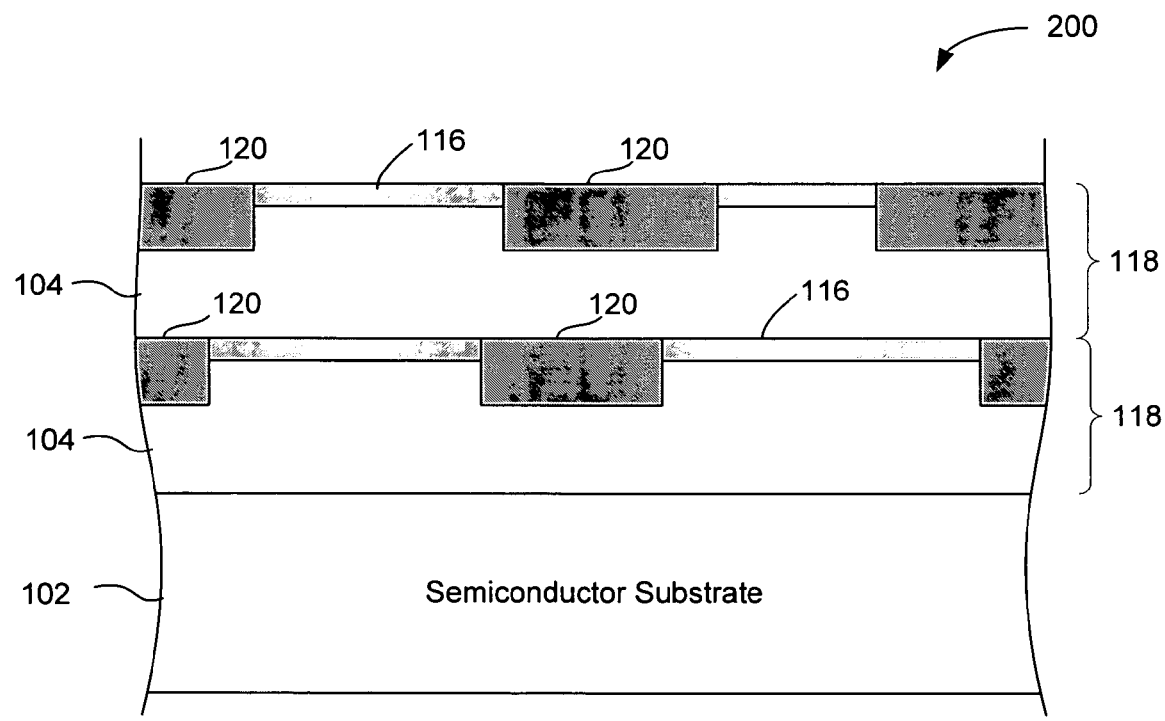
FIG. 7 illustrates an alternative but common embodiment of a semiconductor device, which includes multiple metal layers.

FIG. 6 illustrates a partial, top plan view of a polished dielectric layer 104 according to one embodiment of the present invention. Top surface 119 of dielectric layer 104 includes resistors 120 that are in an electrical circuit with conductive traces 122. As described in the preceding figures, resistors 120 and conductive traces 122 are formed of conductive material that has been deposited into etched regions of dielectric layer 104. As shown, resistors 120 form part of an electrical circuit and control the electrical functioning of the circuit including but not limited to controlling the timing of signals, voltage drops, shunts The size and depth of resistors 120 vary depending upon the pattern used in the photolithography process. The size and depth of each resistor 120 affects its size and therefore the amount of its resistance. The depth of each resistor 120 is affected by the selected depth of the polishing process.

FIG. 7 illustrates an alternative but common embodiment of a semiconductor device 200, which includes multiple metal layers 118. Semiconductor device 200 includes two metal layers 118 wherein a second metal layer 118 is stacked on top of a first metal layer 118. Each metal layer contains resistors 120 and conductive traces (not shown). The additional metal layer 118 provides additional electrical connectivity for the integrated devices within semiconductor substrate 102. The traces of the metal layers 118 are connected through vias that pass through the thickness of each dielectric layer 104.

The upper metal layer 118 is formed in a manner similar to the technique described for fabricating the bottom metal layer 118 in FIGS. 1-5. Resistors 120 in the upper metal layer 118 may have different resistance levels than those of the bottom metal layer 118. As with the bottom metal layer 118, the resistance level of each resistor 120 in the upper metal layer 118 can also have different values. It is common that the upper metal layer 118 has a different pattern of conductive traces and resistors 120. It is also common for a semiconductor device to have more than two metal layers 118.

The implanting process as described with FIG. 4 may be adjusted to affect the depth to which oxygen molecules are implanted. The depth of implanting molecules can be selected to fill the conductive material within a recessed region completely or partially. The dosage of oxygen implanting can also be adjusted with regard to the concentration of oxygen for implanting into the conductive material. For example, metal oxides that require more atoms of oxygen to react with a certain metal require a higher concentration of oxygen. A technician can use resistance chart or graph and other data to determine the amount of oxygen to implant into a metal to obtain a desired resistance level.

As discussed above, the dimensions of resistors 120 can be adjusted to obtain a desired resistance level. As seen from the top plan view of FIG. 6, the length, width, and shape of resistors 120 can be determined during the photolithography and etching process. As discussed with FIG. 5, the depth of resistors 120 also determines the resistance level. The amount of polishing determines the thickness of resistors 120 and therefore also affects resistance levels.

In some embodiments of the invention, the conductive material can be implanted with elements other than oxygen. For example, boron, and carbon may also be used.

The ability to form electrical devices within the metal layers of a semiconductor device is advantageous for several reasons. One advantage is that forming electrical devices within metal layers saves space within a semiconductor substrate for forming other integrated devices. In other words, this provides flexibility in designing the circuits within a semiconductor substrate. Also, forming resistors through implanting processes is much more precise than through common saliciding techniques.

Figure 8:
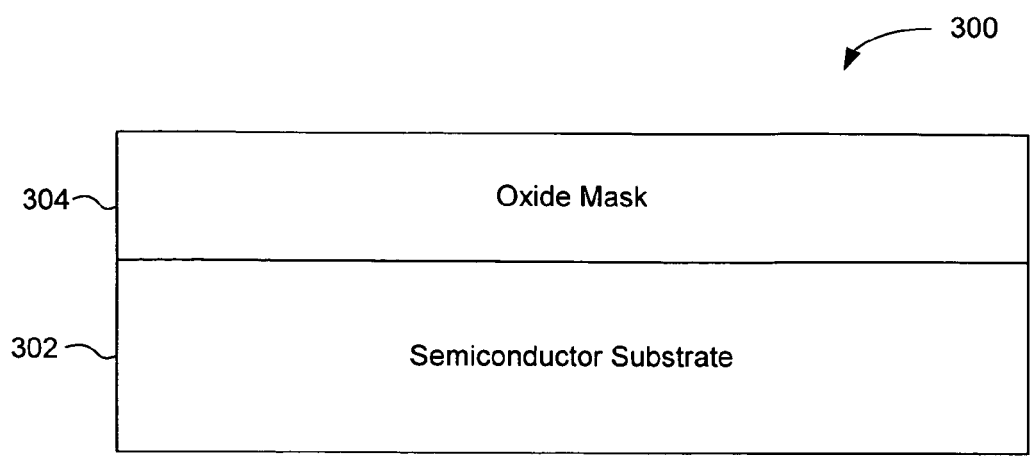
FIG. 8 illustrates a partial side, cross-sectional view of a partially formed semiconductor device, which includes a semiconductor substrate and a dielectric mask, according to one embodiment of the present invention.

The second embodiment, shown in FIGS. 8-14, involves depositing copper onto a dielectric layer to form electrically conductive traces and resistors. FIGS. 8-14 illustrate a semiconductor device 300 in it various stages as it is fabricated according to techniques of the present invention. FIG. 8 illustrates a partial side, cross-sectional view of a partially formed semiconductor device 300, which includes a semiconductor substrate 302 and a dielectric mask 304, according to one embodiment of the present invention. Once again, only a small portion of substrate 302 is shown so that greater detail for dielectric material layer 304 can be shown in the following figures. Semiconductor substrate 302 is a substrate of semiconductor material that has been through the "front-end" processing operations common to semiconductor fabrication techniques.

Figure 9:
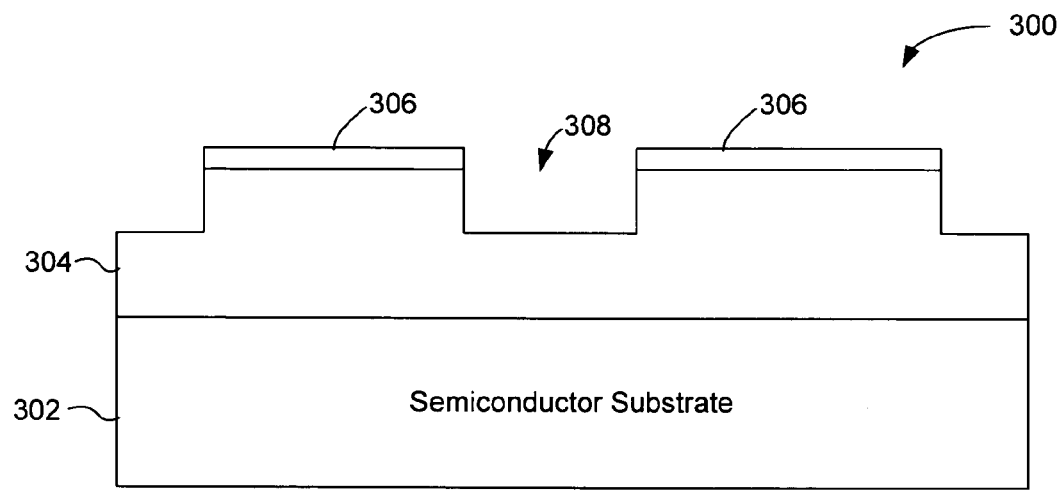
FIG. 9 illustrates the semiconductor device after a photoresist mask has been applied and developed, and after an etching process has been performed.

FIG. 9 illustrates semiconductor device 300 after a photoresist mask 306 has been applied and developed, and after an etching process has been performed. The photoresist mask 306 is typically applied over the entire surface of dielectric layer 304 through commonly understood techniques. Then a light source and a reticle are used to illuminate a pattern of light onto photoresist mask 306. Depending upon whether photoresist mask 306 is a positive tone or a negative tone mask, either the illuminated or non-illuminated portions of photoresist mask 106 are removed. The remaining photoresist mask 306 then has a pattern that corresponds to the illuminated pattern of light. The pattern of the remaining photoresist mask 306 outlines areas of exposed dielectric layer 304 that are to be etched. The areas to be etched will form electronic devices, such as resistors, and conductive pathways or traces. The outline for the conductive pathways may be thin and long paths. The electronic devices are connected to some of the conductive pathways so that they combine to form electrical circuits. These electrical circuits then travel down through dielectric layer 304 and connect to integrated devices within semiconductor substrate 302.

The two sections of photoresist mask 306, shown in FIG. 9, are remaining portions of photoresist mask 306 that outline the shape of an etched region 308 that will be used to form an electrical device. Etched regions for forming conductive traces are not shown in FIGS. 8-14 to focus the discussion upon forming the electrical devise within recessed regions 308.

Figure 10:
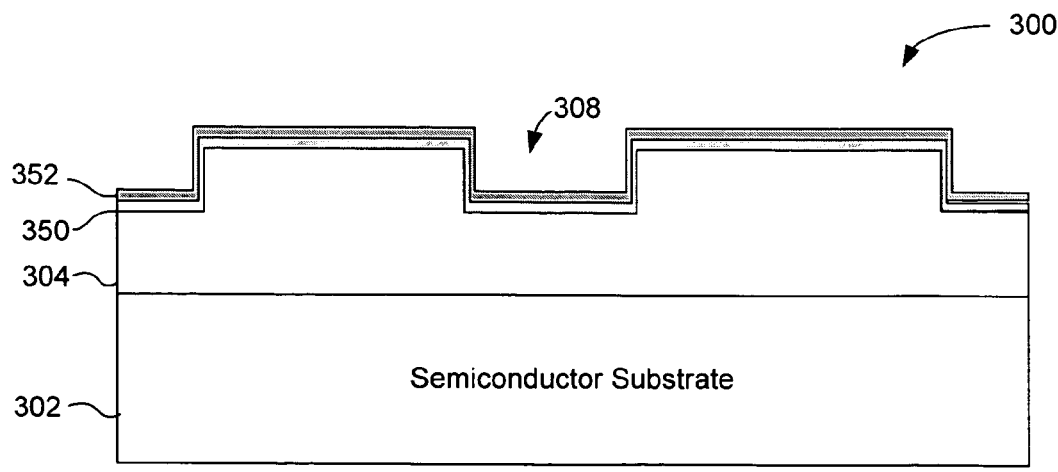
FIG. 10 illustrates the semiconductor device after the photoresist mask has been removed and a lining layer and a seed layer have been deposited onto the etched dielectric layer.

FIG. 10 illustrates semiconductor device 300 after photoresist mask 306 has been removed and a lining layer 350 and a seed layer 352 have been deposited onto the etched dielectric layer 304. Lining layer 350 and seed layer 352 may be deposited using commonly known deposition processes such as chemical vapor deposition or physical vapor deposition. Lining layer 350 serves to protect dielectric mask 304 from diffusion of the conductive material that will soon be deposited above the seed layer 352, and vice-versa. Lining layer 350 is also known as a barrier lining. Lining layer 350 may be formed of tantalum and tantalum nitride. Seed layer 352 provides a surface upon which a conductive material can be deposited in the following process steps. For example, seed layer 352 can be formed of the same material that will be deposited in the following process step. In the description of the present invention, the seed layer 352 is formed of copper since copper is to be deposited to form resistors and conductive traces.

Figure 11:
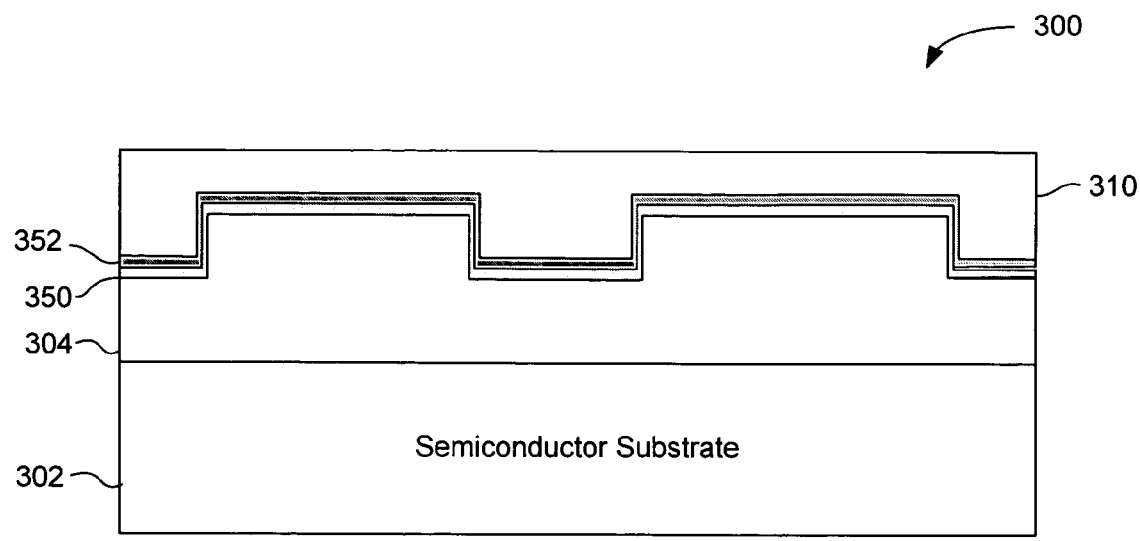
FIG. 11 illustrates the semiconductor device after a conductive material has been deposited upon seed layer.

FIG. 11 illustrates semiconductor device 300 after a conductive material 310 has been deposited upon seed layer 352. As discussed conductive material 110 is copper, however other conductive materials may substitute for copper. The copper conductive material 310 is commonly deposited using an electroplating technique, which involves dipping the semiconductor device 300 into a bath of liquid copper. As shown, a layer of copper 310 is formed above seed layer 352 such that recessed regions 308 are filled. Recessed regions for conductive traces are also filled in during the electroplating process.

Figure 12:
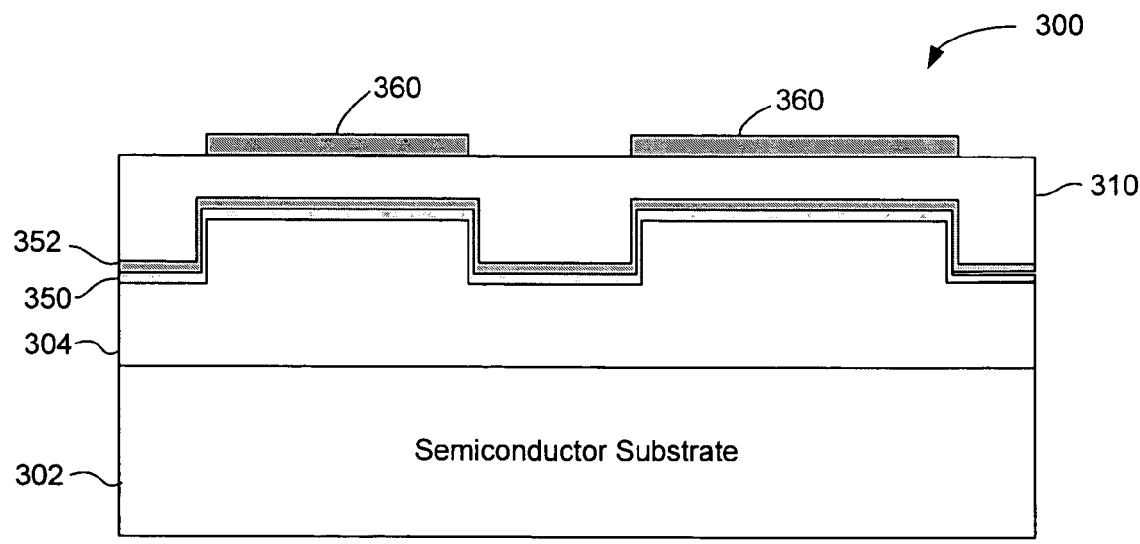
FIG. 12 illustrates the semiconductor device after a photoresist mask has been applied over the copper layer, exposed, and developed.

FIG. 12 illustrates semiconductor device 300 after a photoresist mask 360 has been applied over the copper layer 310, exposed, and developed. The photoresist layer is exposed and developed to uncover the areas of conductive material 310 that are to be selectively implanted with oxygen. That is, conductive material 310 within recessed regions 308 will be exposed for the implanting process. At the same time, areas of conductive material 310 that will form conductive traces are left covered by the photoresist layer to prevent oxygen implantation. In this way, resistance is not added to the conductive pathways. After implantation, the photoresist layer can be optionally stripped. Stripping is optional since a polishing process will remove the photoresist layer and at least a portion of the underlying conductive material 310 and dielectric layer 304.

Figure 13:
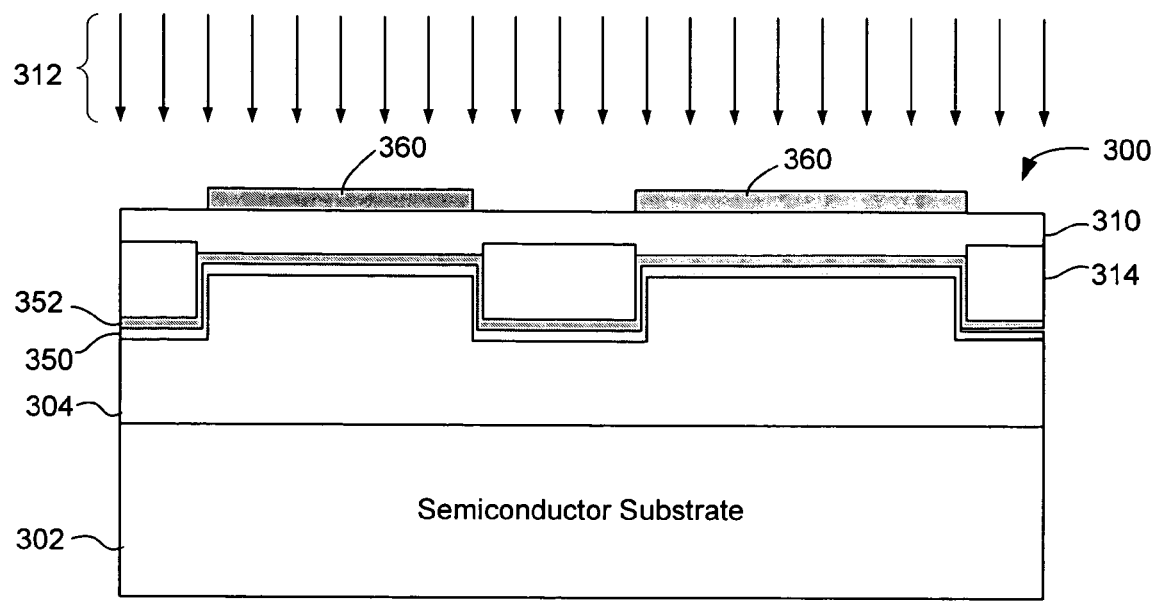
FIG. 13 illustrates the semiconductor device while undergoing an oxygen implanting process.

FIG. 13 illustrates semiconductor device 300 while undergoing an oxygen implanting process. The array of downwardly pointing directional lines 312 represent oxygen molecules being implanted into the surface of conductive material 310. The oxygen molecules are implanted with a force that causes at least some of the molecules to reach the conductive material 310 at the bottom of each recessed region 308. Dotted areas 314 represent oxygen-implanted regions of conductive material 310. Each of dotted areas 314 have regions of at least substantially pure conductive material above them since the oxygen molecules passed through and did not settle in these upper regions. Photoresist layer 360 protects the corresponding underlying conductive material 310 for absorbing oxygen molecules.

Figure 14:
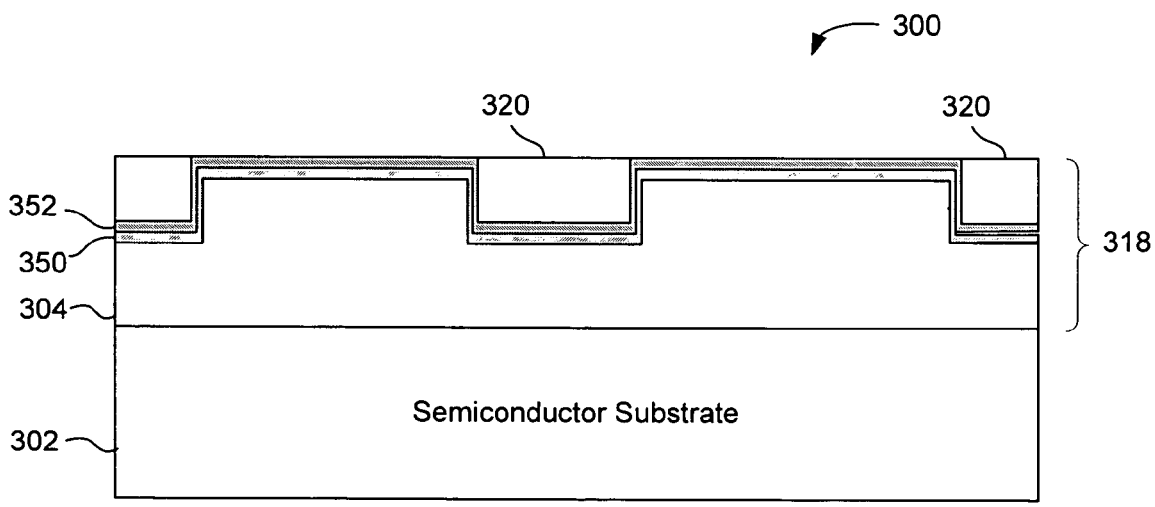
FIG. 14 illustrates the semiconductor device after a polishing process has removed a layer of conductive material and photoresist to result in a substantially flat metal layer surface.

FIG. 14 illustrates semiconductor device 300 after a polishing process has removed a layer of conductive material 310 and photoresist 360 to result in a substantially flat metal layer 318 surface. Metal layer 318 includes the dielectric layer 304, conductive material, and oxygen-implanted conductive material. Depending upon the amount of polishing performed, a portion of the oxygen implanted conductive material 314, seed layer 352, and liner layer 350 may also be removed.

The polished semiconductor device 300 is then put through an annealing process where it is heated. The annealing process causes the oxygen molecules to react with the molecules of the conductive material 310 to form, for example, a metal oxide. For example, a copper conductive material 310 will combine with the oxygen molecules to form a copper oxide, $Cu_2O$. The resulting metal oxide will have a resistance level useful for acting as a resistor. Therefore, the conductive material within each recessed region 308 forms an individual resistor 320.

Other types of electrical devices that can be formed in the metal layers include resistors, conductors, and MIM (Metal Insulator Metal) capacitors.

Other conductive metals that may be deposited upon a dielectric layer to form conductive traces and electrical devices include semiconductor materials. For example, titanium, tantalum, Molybdenum may also be used. Titanium and tantalum tend to form low resistance oxides. On the other hand, copper and aluminum oxides tend to have higher resistance values.

In some embodiments, only some of the metal layers may include electronic devices such as resistors. For example, the metal layer directly on top of the semiconductor substrate may only have conductive traces. The layers above this first metal layer may then include electronic devices, such as resistors. In other embodiments, every metal layer may include electronic devices.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A method for forming a semiconductor device comprising:
   forming a dielectric mask on a top surface of a semiconductor substrate, the semiconductor substrate containing a plurality of integrated devices;
   etching recessed regions into a top surface of the dielectric mask;
   filling the recessed regions with aluminum;
   implanting the aluminum within each recessed region with a dopant material selected from among carbon and boron, to form a respective resistor; and
   annealing the resistors to cause the dopant material to react with the aluminum to adjust the level of resistance in each resistor.

2. A method as recited in claim 1 further comprising:
   etching recessed channels into the top surface of the dielectric mask wherein at least some of the recessed channels connect to respective recessed regions; and filling in the recessed channels with aluminum to form conductive traces wherein some of the traces are integrally formed with the resistors that are formed in the recessed regions, wherein the conductive traces provide for electrical connectivity between integrated devices within the semiconductor substrate.

3. A method as recited in claim 1 further comprising operations that precede the operation of implanting the resistors, such operations including:
applying a photoresist layer over the dielectric mask and the resistors;
exposing the photoresist layer to a pattern of light;
developing the photoresist layer to expose the resistors; and
then proceeding onto the implanting process.

4. The method as recited in claim 3 wherein the photoresist layer is patterned so that the thickness of the photoresist layer is optimized to control the dosage of the dopant into recessed metal layers.

5. The method as recited in claim 3 wherein the photoresist layer is patterned so that the photoresist layer has at least a first thickness and a second thickness wherein the first thickness overlies a metal filled first recess and wherein the second thickness overlies a metal filled second recess and wherein the first thickness is different that the second thickness and whereby each the first and second thicknesses are optimized to control the dosage of the dopant into the associated underlying recessed metal layers and wherein said implanting results in resistors having different resistances.

6. A method as recited in claim 1 further comprising:
selecting a dosage of the dopant for implanting into the resistor in order to give the resistors a desired level of resistance.

7. A method as recited in claim 1 wherein the operation of filling the recessed channels and regions uses an electroplating processes.

8. A method as recited in claim 1 further comprising:
polishing the top surface of the dielectric mask and a top surface of the resistors such that the top surfaces of the dielectric mask and the resistors are substantially coplanar and flat.

9. The method as recited in claim 1 wherein the filling the recessed regions with aluminum comprises forming an aluminum layer on the dielectric mask to a thickness that is optimized to control the dosage of the dopant into the recessed aluminum.

10. A method for forming a semiconductor device comprising:
providing a semiconductor substrate having a plurality of integrated devices formed thereon;
defining a resistor sites for the substrate;
placing aluminum on the resistor sites; and
implanting the aluminum with a dopant material selected from among carbon and boron, to form resistors at the implanted aluminum sites.

* * * * *